United States Patent
Tanaka

(10) Patent No.: US 9,012,976 B2
(45) Date of Patent: Apr. 21, 2015

(54) SEMICONDUCTOR DEVICE AND METHOD FOR MANUFACTURING THE SAME

(71) Applicant: Kabushiki Kaisha Toshiba, Minato-ku (JP)

(72) Inventor: Hiroyasu Tanaka, Mie-ken (JP)

(73) Assignee: Kabushiki Kaisha Toshiba, Minato-Ku (JP)

( * ) Notice: Subject to any disclaimer, the term of this patent is extended or adjusted under 35 U.S.C. 154(b) by 28 days.

(21) Appl. No.: 13/951,744

(22) Filed: Jul. 26, 2013

(65) Prior Publication Data

US 2014/0027835 A1 Jan. 30, 2014

(30) Foreign Application Priority Data

Jul. 27, 2012 (JP) ................. 2012-167689

(51) Int. Cl.
*H01L 29/792* (2006.01)
*H01L 29/66* (2006.01)
*H01L 27/115* (2006.01)

(52) U.S. Cl.
CPC ........ *H01L 29/792* (2013.01); *H01L 29/66833* (2013.01); *H01L 29/7926* (2013.01); *H01L 27/11582* (2013.01)

(58) Field of Classification Search
USPC .......................................... 257/324, E29.309
See application file for complete search history.

(56) References Cited

U.S. PATENT DOCUMENTS

| | | | |
|---|---|---|---|
| 6,201,286 B1 | 3/2001 | Nagasaka | |
| 6,458,670 B2 | 10/2002 | Nagasaka | |
| 6,870,215 B2 | 3/2005 | Endoh et al. | |
| 7,855,433 B2 | 12/2010 | Ebihara | |
| 7,936,004 B2 | 5/2011 | Kito et al. | |
| 8,569,827 B2* | 10/2013 | Lee et al. ............. | 257/324 |
| 2001/0003053 A1 | 6/2001 | Nagasaka | |
| 2009/0057830 A1 | 3/2009 | Ebihara | |
| 2010/0207195 A1 | 8/2010 | Fukuzumi et al. | |
| 2011/0180866 A1 | 7/2011 | Matsuda et al. | |
| 2012/0068253 A1* | 3/2012 | Oota et al. ............. | 257/324 |
| 2013/0126961 A1 | 5/2013 | Fukuzumi et al. | |

FOREIGN PATENT DOCUMENTS

| | | |
|---|---|---|
| JP | 02-002662 A | 1/1990 |
| JP | 11-054697 A | 2/1999 |
| JP | 2002-237645 A | 8/2002 |
| JP | 2004-040009 A | 2/2004 |
| JP | 2007-250652 A | 9/2007 |
| JP | 2009-054841 A | 3/2009 |

* cited by examiner

*Primary Examiner* — Lex Malsawma

(74) *Attorney, Agent, or Firm* — Oblon, McClelland, Maier & Neustadt, L.L.P.

(57) ABSTRACT

According to one embodiment, the stacked body includes a plurality of insulating layers and a plurality of conductive layers alternately stacked on the underlying film. The first insulating film is provided in a trench piercing the stacked body in a stacking direction of the stacked body and separating the stacked body into a plurality of resistance element blocks in a first direction on the underlying film. The resistance element blocks include a line portion formed of the conductive layer extending in a second direction crossing the first direction and the stacking direction and a hole formation portion provided to protrude in the first direction from the line portion and including a second insulating film provided in a hole piercing the stacked body in the stacking direction.

17 Claims, 8 Drawing Sheets

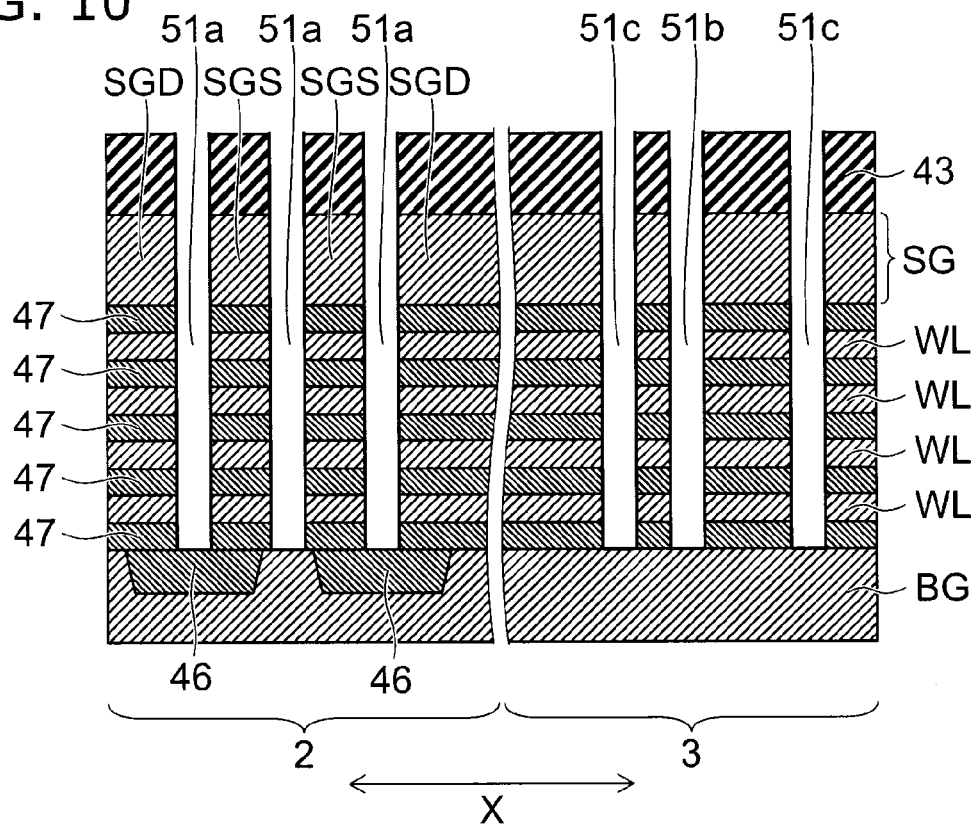
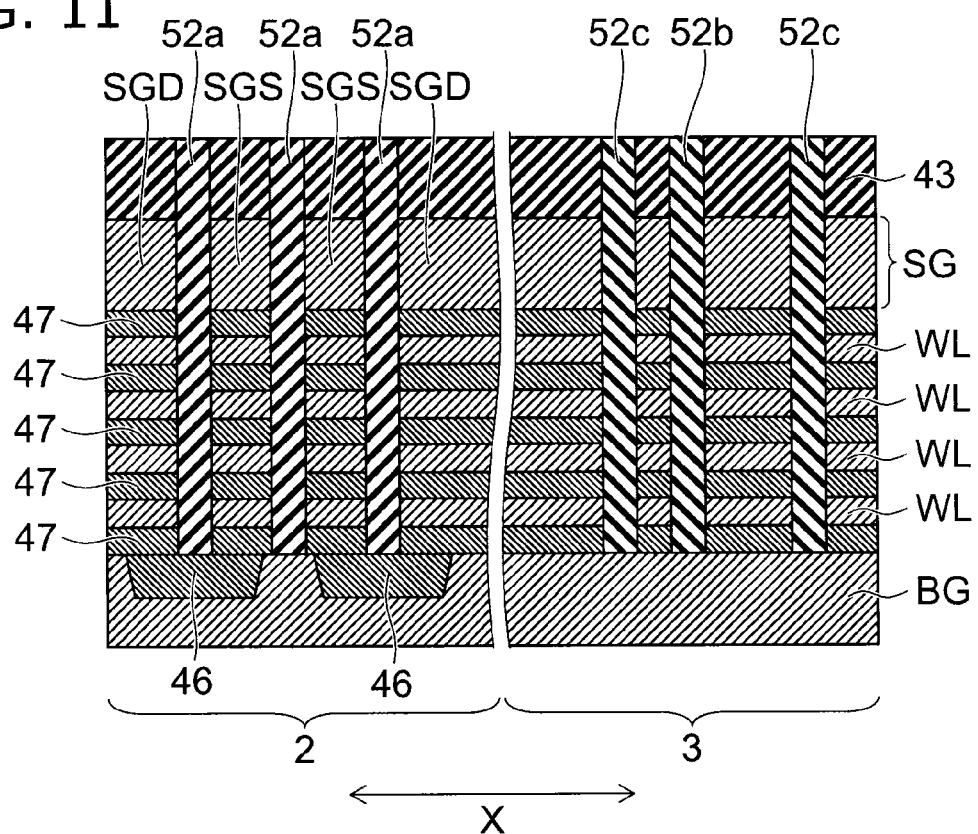

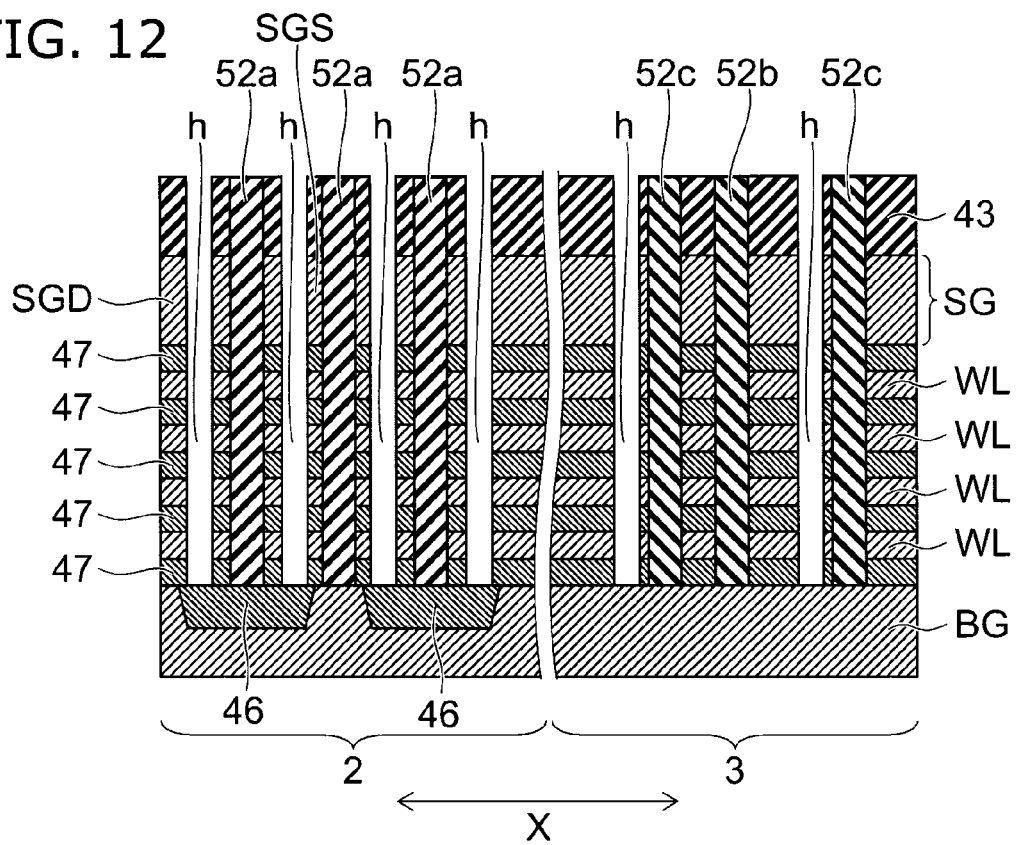
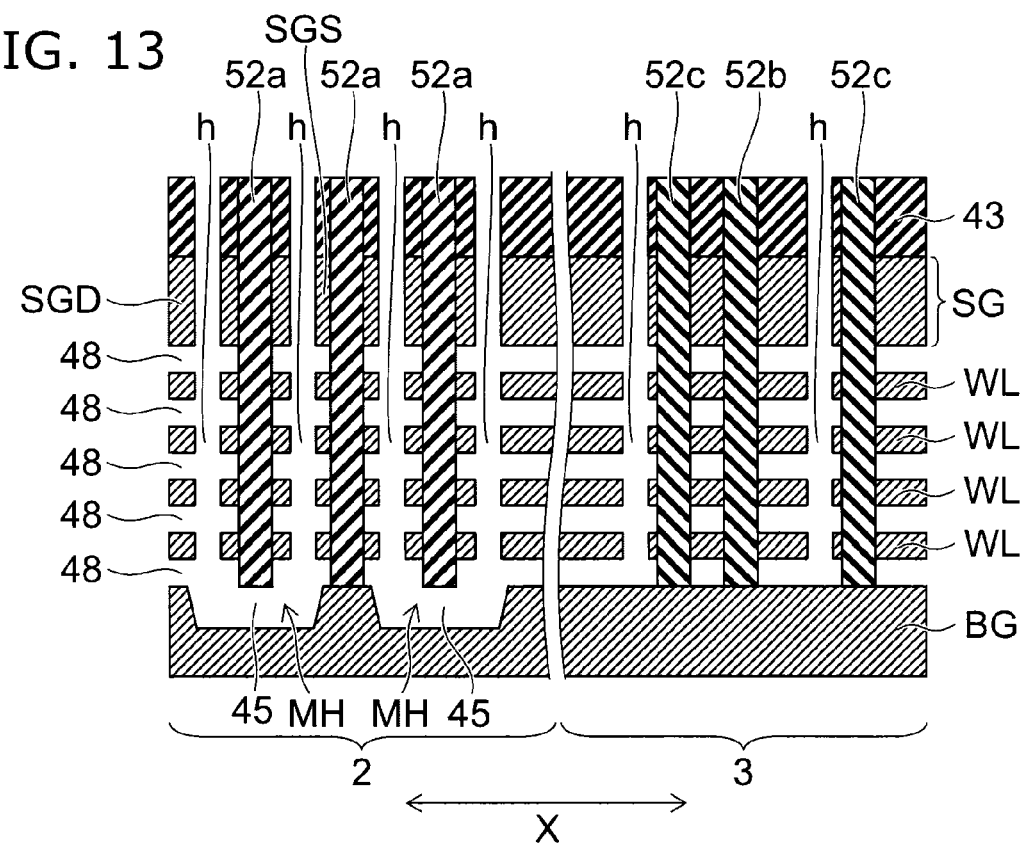

SEMICONDUCTOR DEVICE AND METHOD FOR MANUFACTURING THE SAME

CROSS-REFERENCE TO RELATED APPLICATIONS

This application is based upon and claims the benefit of priority from Japanese Patent Application No. 2012-167689, filed on Jul. 27, 2012; the entire contents of which are incorporated herein by reference.

FIELD

Embodiments described herein relate generally to a semiconductor device and a method for manufacturing the same.

BACKGROUND

A memory device of a three-dimensional structure is proposed in which a memory hole is formed in a stacked body in which a conductive layer functioning as the control gate of a memory cell and an insulating layer are alternately stacked in plural, and a silicon body serving as a channel is provided on the side wall of the memory hole via a charge storage film. A resistance element of a peripheral circuit is formed using polysilicon that is the material of the gate electrode of a CMOS formed on the surface of a substrate.

BRIEF DESCRIPTION OF THE DRAWINGS

FIG. 6 to FIG. 13 are schematic cross-sectional views showing a method for manufacturing the semiconductor device of the embodiment.

DETAILED DESCRIPTION

Figure 1:
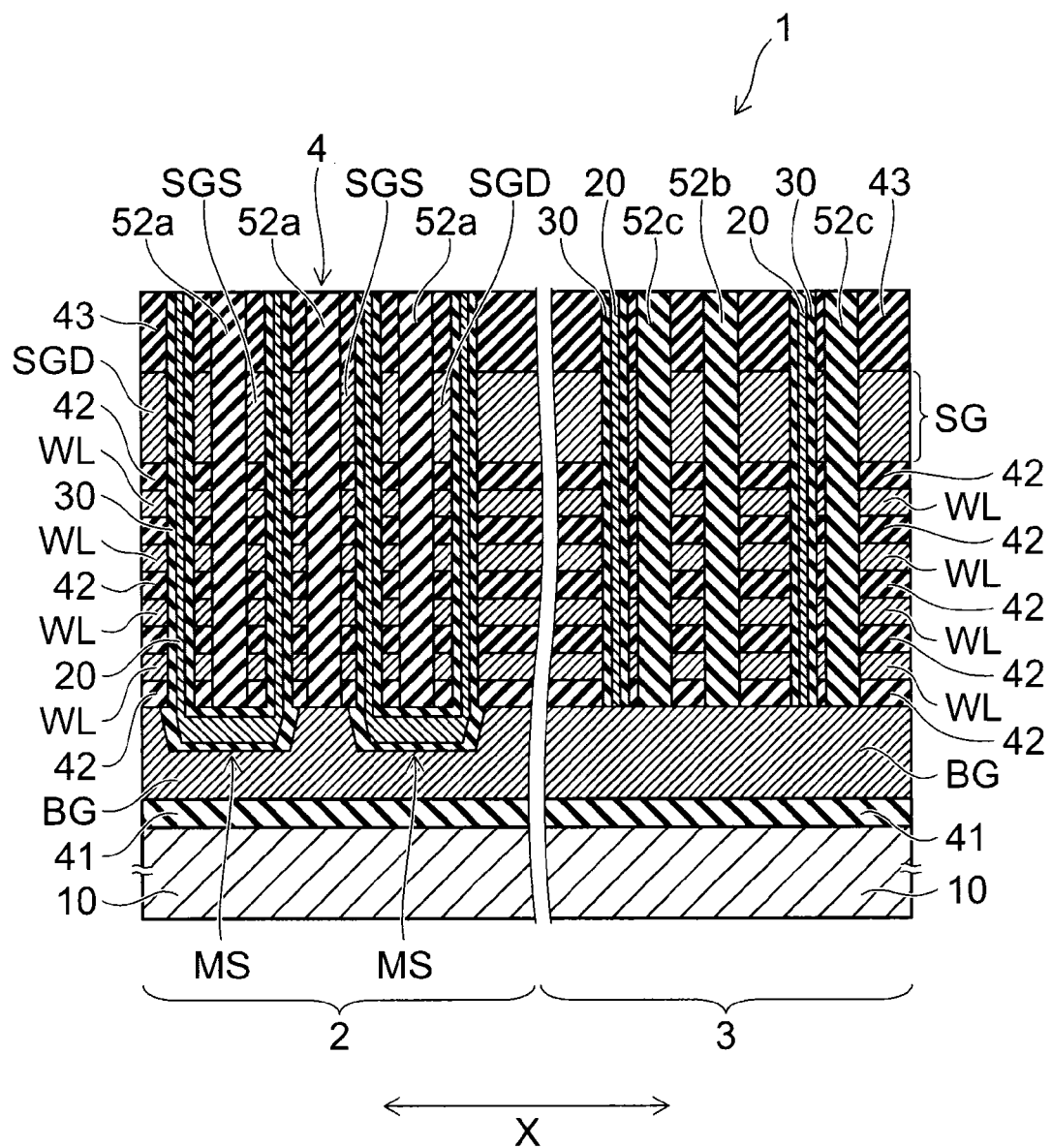
FIG. 1 is a schematic cross-sectional view of a semiconductor device of an embodiment.

According to one embodiment, a semiconductor device includes a underlying film, a stacked body and a first insulating film. The stacked body includes a plurality of insulating layers and a plurality of conductive layers alternately stacked on the underlying film. The first insulating film is provided in a trench piercing the stacked body in a stacking direction of the stacked body and separating the stacked body into a plurality of resistance element blocks in a first direction on the underlying film. The resistance element blocks include a line portion formed of the conductive layer extending in a second direction crossing the first direction and the stacking direction of the stacked body and a hole formation portion provided to protrude in the first direction from the line portion and including a second insulating film provided in a hole piercing the stacked body in the stacking direction of the stacked body.

Various embodiments will be described hereinafter with reference to the accompanying drawings. In the drawings, identical components are marked with the same reference numerals.

FIG. 1 is a schematic cross-sectional view of a semiconductor device 1 of an embodiment.

The semiconductor device 1 of the embodiment includes a stacked body in which a conductive layer WL and an insulating layer 42 are alternately stacked in plural. In a planar view, the stacked body is roughly divided into a memory region 2 and a peripheral region 3 around the memory region 2.

The stacked body mentioned above is provided on a back gate BG as an underlying film. The back gate BG is a conductive film, and is, for example, a silicon film doped with an impurity. The back gate BG is provided on a substrate 10 via an insulating layer 41.

A memory cell array 4 is provided in the memory region 2.

Figure 4:
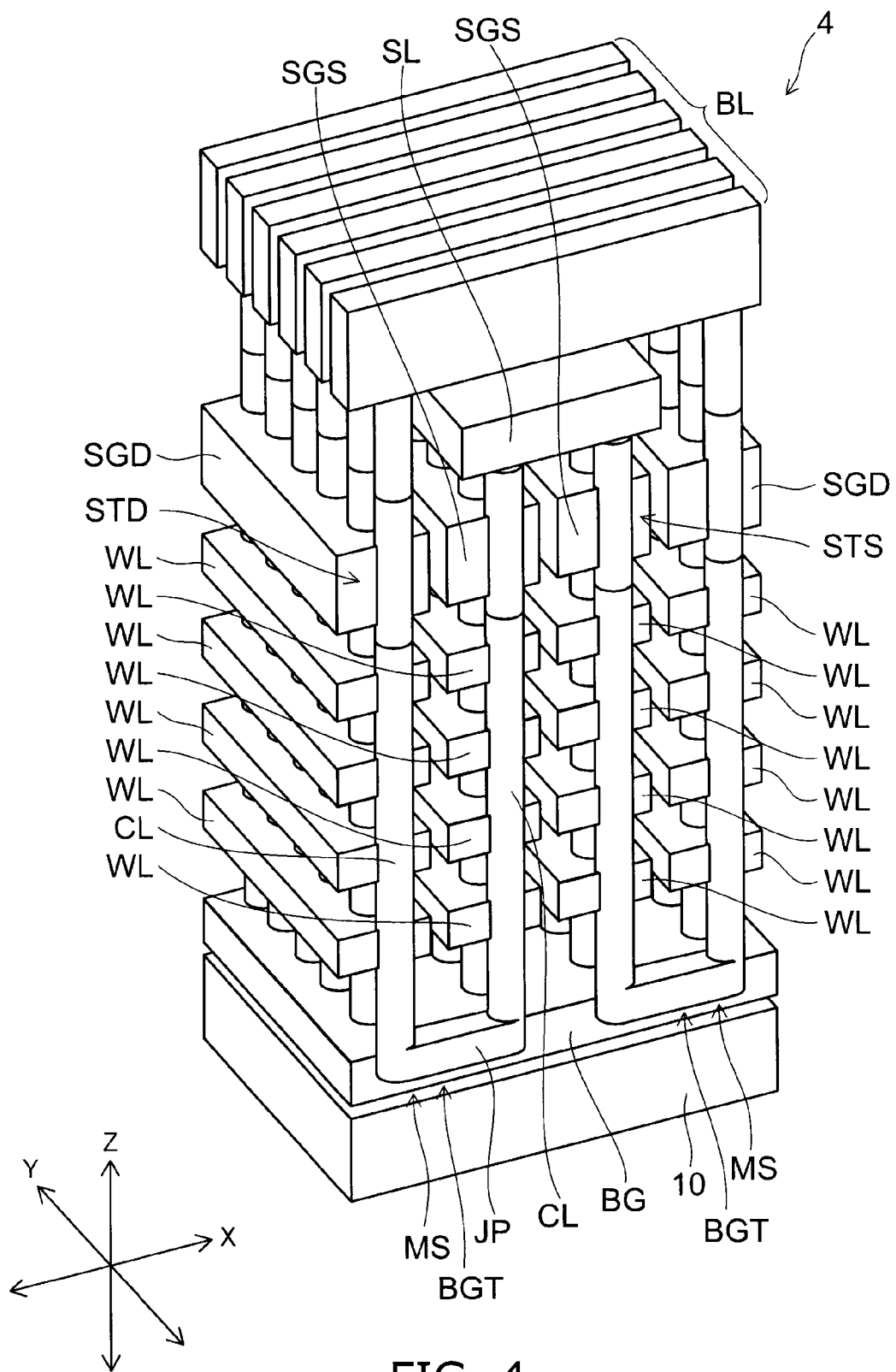
FIG. 4 is a schematic perspective view of a memory cell array in the semiconductor device of the embodiment.

FIG. 4 is a schematic perspective view of the memory cell array 4. In FIG. 4, the illustration of the insulating portions is omitted for easier viewing of the drawing. Although four conductive layers WL, for example, are illustrated in FIG. 1 and FIG. 4, the number of conductive layers WL is arbitrary.

In FIG. 4, an XYZ orthogonal coordinate system is introduced. Two directions parallel to the major surface of the substrate 10 and orthogonal to each other are defined as the X direction (a first direction) and the Y direction (a second direction), and the direction orthogonal to both of the X direction and the Y direction is defined as the Z direction (the stacking direction of the stacked body or a third direction). The cross section of the memory cell array 4 shown in FIG. 1 shows a cross section parallel to the XZ plane in FIG. 4.

The memory cell array 4 includes a plurality of memory strings MS. One memory string MS is formed in a U-shaped configuration including a pair of columnar portions CL extending in the Z direction and a joining portion JP joining the lower ends of the pair of columnar portions CL.

Figure 5:
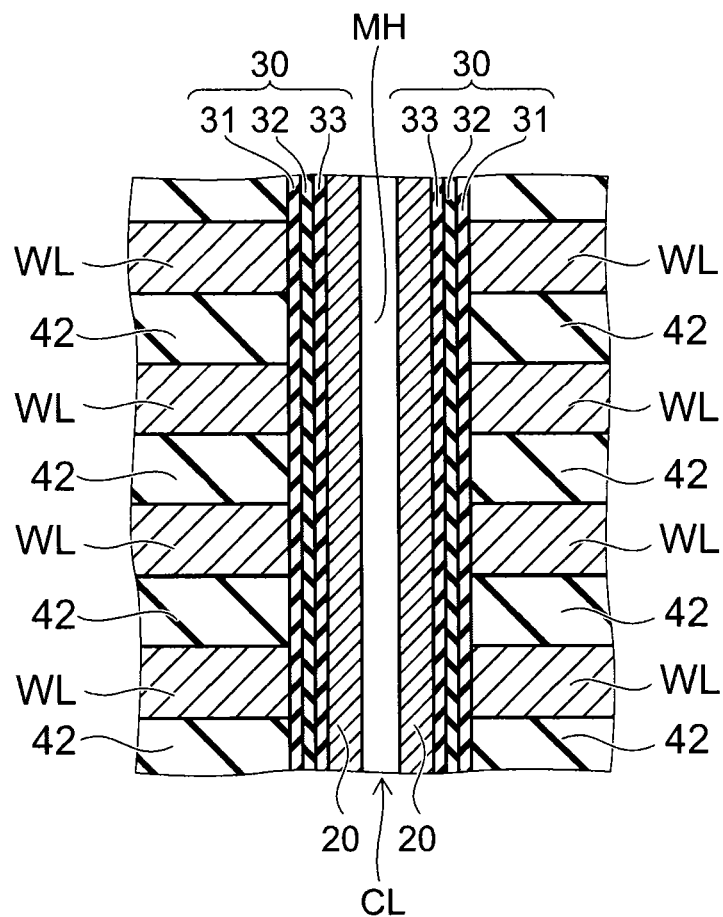
FIG. 5 is a schematic cross-sectional view of a part of the memory cell array in FIG. 4.

FIG. 5 shows an enlarged cross-sectional view of the columnar portion CL of the memory string MS.

The conductive layer WL is a polysilicon film doped with, for example, boron or phosphorus as an impurity (a first silicon film). The conductive layer WL of the memory cell array 4 has an electrical conductivity sufficient to function as the gate electrode of a memory cell.

The insulating layers 41 and 42 are, for example, a film mainly containing silicon oxide. Alternatively, a film mainly containing silicon nitride may be used as the insulating layers 41 and 42.

A drain-side select gate SGD is provided in the upper end portion of one of the pair of columnar portions CL of the U-shaped memory string MS, and a source-side select gate SGS is provided in the upper end portion of the other of the pair of columnar portions CL. The drain-side select gate SGD and the source-side select gate SGS are provided on the uppermost conductive layer WL via the insulating layer 42.

The drain-side select gate SGD and the source-side select gate SGS are a polysilicon film doped with, for example, boron or phosphorus as an impurity similarly to the conductive layer WL, and have an electrical conductivity sufficient to function as the gate electrode of a select transistor. The thickness of the drain-side select gate SGD and the thickness of the source-side select gate SGS are thicker than the thickness of each of the conductive layers WL.

The drain-side select gate SGD and the source-side select gate SGS are separated in the X direction by an insulating film 52a (shown in FIG. 1) provided in a trench 51a shown in FIG. 10.

Also the stacked body under the drain-side select gate SGD and the stacked body under the source-side select gate SGS are separated in the X direction by the insulating film 52a provided in the trench 51a. Also the stacked body between memory strings MS adjacent in the X direction is separated in the X direction by the insulating film 52a provided in the trench 51a.

An insulating layer 43 is provided on the source-side select gate SGS and on the drain-side select gate SGD as shown in FIG. 1. A source line SL shown in FIG. 4 is provided on the source-side select gate SGS via the insulating layer 43. The source line SL is, for example, a metal film.

Bit lines BL that are a plurality of metal interconnections are provided on the drain-side select gate SGD and the source line SL via the insulating layer 43. Each bit line BL extends in the X direction.

The memory string MS includes a channel body 20 provided in a U-shaped memory hole formed in the stacked body including the back gate BG, the plurality of conductive layers WL, the insulating layer 41, the plurality of insulating layers 42, the drain-side select gate SGD, and the source-side select gate SGS.

The channel body 20 is provided in the U-shaped memory hole via a memory film 30. The channel body 20 is, for example, a silicon film. As shown in FIG. 5, the memory film 30 is provided on the side wall of the memory hole MH. The memory film 30 is provided between the side wall of the memory hole MH and the channel body 20.

Although FIG. 5 illustrates a structure in which the channel body 20 is provided such that a hollow portion remains on the central axis side of the memory hole MH, the entire space in the memory hole MH may be filled up with the channel body 20, or a structure in which an insulating film is buried in the hollow portion on the inside of the channel body 20 is possible.

The memory film 30 includes a block film 31, a charge storage film 32, and a tunnel film 33. The block film 31, the charge storage film 32, and the tunnel film 33 are provided in this order from the conductive layer WL side between each conductive layer WL and the channel body 20. The block film 31 is in contact with each conductive layer WL, the tunnel film 33 is in contact with the channel body 20, and the charge storage film 32 is provided between the block film 31 and the tunnel film 33.

As described later, the insulating layer 42 between conductive layers WL is formed simultaneously with the memory film 30. Therefore, the insulating layer 42 contains at least the same material as the block film 31 in the memory film 30.

The channel body 20 functions as a channel in a memory cell, the conductive layer WL functions as the control gate of the memory cell, and the charge storage film 32 functions as a data memory layer that stores a charge injected from the channel body 20. That is, a memory cell with a structure in which the control gate surrounds the periphery of the channel is formed at the intersection between the channel body 20 and each conductive layer WL.

The semiconductor device of the embodiment is a nonvolatile semiconductor memory device that can perform the erasing and writing of data electrically in a free manner and can retain the memory content even when the power is turned off.

The memory cell is, for example, a charge trap memory cell. The charge storage film 32 includes a large number of trap sites that trap a charge, and is a silicon nitride film, for example.

The tunnel film 33 is, for example, a silicon oxide film, and forms a potential barrier when a charge is injected from the channel body 20 into the charge storage film 32 or when the charge stored in the charge storage film 32 is diffused to the channel body 20.

The block film 31 is, for example, a silicon oxide film, and prevents the charge stored in the charge storage film 32 from diffusing to the conductive layer WL.

The drain-side select gate SGD, the channel body 20, and the memory film 30 between them constitute a drain-side select transistor STD (shown in FIG. 4). Above the drain-side select gate SGD, the channel body 20 is connected to the bit line BL.

The source-side select gate SGS, the channel body 20, and the memory film 30 between them constitute a source-side select transistor STS (shown in FIG. 4). Above the source-side select gate SGS, the channel body 20 is connected to the source line SL.

The back gate BG, and the channel body 20 and the memory film 30 provided in the back gate BG constitute a back gate transistor BGT (shown in FIG. 4).

The memory cell using each conductive layer WL as the control gate is provided in plural between the drain-side select transistor STD and the back gate transistor BGT. Similarly, the memory cell using each conductive layer WL as the control gate is provided in plural also between the back gate transistor BGT and the source-side select transistor STS.

The plurality of memory cells, the drain-side select transistor STD, the back gate transistor BGT, and the source-side select transistor STS are connected in series via the channel body 20, and constitute one U-shaped memory string MS. The memory string MS is arranged in plural in the X direction and the Y direction; thus, a plurality of memory cells are provided three-dimensionally in the X direction, the Y direction, and the Z direction.

Figure 2:
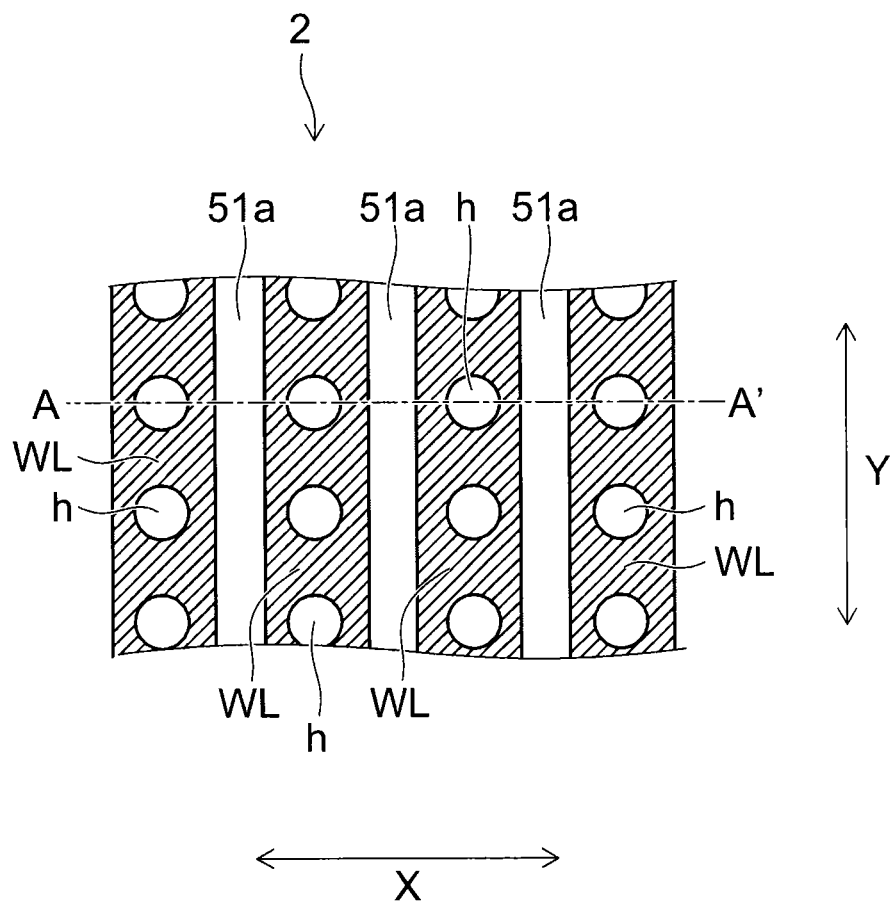
FIG. 2 is a schematic plan view of a memory region in the semiconductor device of the embodiment.

FIG. 2 is a schematic plan view of the stacked body including the conductive layer WL in the memory region 2. In FIG. 2, the illustration of the insulating film in the trench 51a, and the memory film 30 and the channel body 20 in a hole h is omitted. The cross section of the memory region 2 in FIG. 1 corresponds to the A-A' cross section in FIG. 2.

The conductive layer WL is separated into a plurality of pieces in the X direction by the trench 51a. Although FIG. 2 illustrates one conductive layer WL, also the conductive layers WL on the other stories stacked above or below the conductive layer WL shown in FIG. 2 are separated in the X direction by the trench 51a.

Each conductive layer WL separated in the X direction extends in the Y direction crossing (in the drawing, orthogonal to) the X direction and the stacking direction of the stacked body (the Z direction). A plurality of holes h are formed in each conductive layer WL extending in the Y direction. The plurality of holes h are aligned along the Y direction.

The memory film 30 and the channel body 20 are provided in the hole h to form the columnar portion CL of the memory hole MH described above.

Next, the peripheral region 3 is described.

The stacked body described above on the back gate BG is provided not only in the memory region 2 but also in the peripheral region 3 as shown in FIG. 1. That is, the insulating layer 42 and the conductive layer WL are alternately stacked in plural also on the back gate BG in the peripheral region 3.

No memory cell is provided in the peripheral region 3; therefore, the conductive layer WL in the peripheral region 3 does not function as the control gate of a memory cell. At least one of the plurality of conductive layers WL in the peripheral region 3 functions as a resistance element of a peripheral circuit.

In the peripheral region 3, a select gate SG is provided on the uppermost conductive layer WL via the insulating layer 42. The select gate SG is formed simultaneously with the drain-side select gate SGD and the source-side select gate SGS in the memory cell array 4 using the same material. No select transistor is provided in the peripheral region 3; therefore, the select gate SG in the peripheral region 3 does not function as the select gate of a transistor.

Figure 3A:
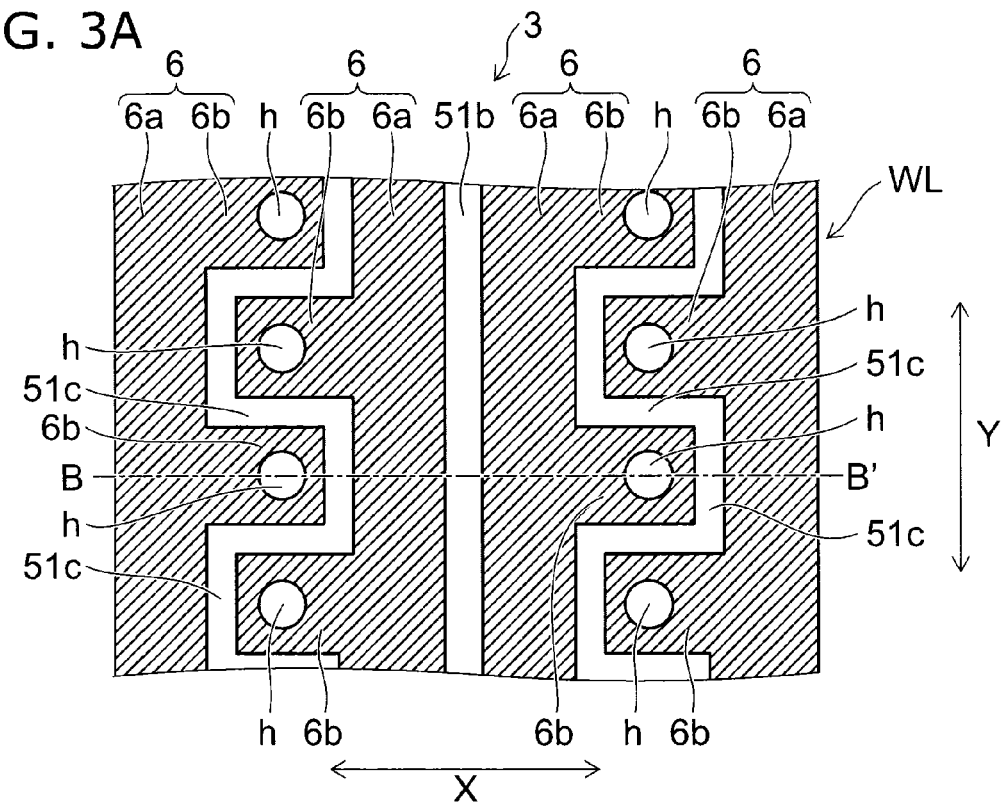
FIGS. 3A and 3B are schematic plan views of a peripheral region in the semiconductor device of the embodiment.

FIG. 3A is a schematic plan view of the stacked body including the conductive layer WL in the peripheral region 3. In FIG. 3A, the illustration of the insulating films in trenches 51b and 51c and the embedded film in the hole h is omitted. The cross section of the peripheral region 3 in FIG. 1 corresponds to the B-B' cross section in FIG. 3A.

The stacked body including the plurality of conductive layers WL in the peripheral region 3 is separated as a plurality of resistance element blocks 6 in the X direction by an insulating film 52b provided in a trench 51b and an insulating film 52c provided in a trench 51c.

Although FIG. 3A illustrates one conductive layer WL in the peripheral region 3, also the conductive layers WL on the other stories stacked above or below the conductive layer WL shown in FIG. 3A are separated as a plurality of resistance element blocks 6 in the X direction.

The trench 51b and the trench 51c are alternately arranged in the X direction. The trench 51b extends in a straight line in the Y direction. The trench 51c extends in the Y direction as a whole while repeating bending in the X direction and bending in the Y direction. That is, the trench 51c has a portion parallel to the X direction and a portion parallel to the Y direction, and the portion parallel to the X direction and the portion parallel to the Y direction are alternately repeated.

One resistance element block 6 has a line portion 6a extending in the Y direction and a hole formation portion 6b provided to protrude in the X direction from the line portion 6a. The line portion 6a and the hole formation portion 6b are formed by the patterning of the conductive layer WL of the same layer. Thus, the line portion 6a and the hole formation portion 6b are both formed of the conductive layer WL.

A plurality of hole formation portions 6b are provided to be aligned in the Y direction for one line portion 6a extending in the Y direction. The line portion 6a has a pair of edges extending in the Y direction (the longitudinal direction). The hole formation portion 6b is provided at one of the pair of edges to protrude in the X direction on the opposite side to the edge.

The hole formation portion 6b of one resistance element block 6 out of resistance element blocks 6 adjacent across the bending trench 51c and the hole formation portion 6b of the other resistance element block 6 protrude in directions opposite to each other. The hole formation portion 6b of the one resistance element block 6 and the hole formation portion 6b of the other resistance element block 6 are alternately aligned in the Y direction via the trench 51c.

That is, the hole formation portions 6b of adjacent resistance element blocks 6 are collectively patterning-formed by the trench 51c bending in the X direction and the Y direction. Thereby, the chip area can be effectively used.

Portions of each hole formation portion 6b other than the portion connected to the line portion 6a are surrounded by the trench 51c.

One hole h is formed in each hole formation portion 6b. As shown in FIG. 12, the hole h pierces the stacked body mentioned above in the peripheral region 3 to reach the back gate BG. As shown in FIG. 10, also the trenches 51b and 51c pierce the stacked body mentioned above in the peripheral region 3 to reach the back gate BG.

As shown in FIG. 1, the insulating film 52b is provided in the trench 51b, and the insulating film 52c is provided in the trench 51c. An embedding material is provided in the hole h. For example, in the embodiment, the same film as the film provided in the hole h of the memory cell array 4 (the memory film 30 and the channel body 20) is provided also in the hole h in the peripheral region 3.

Next, a method for manufacturing the semiconductor device 1 of the embodiment is described with reference to FIG. 6 to FIG. 13.

Figure 6:
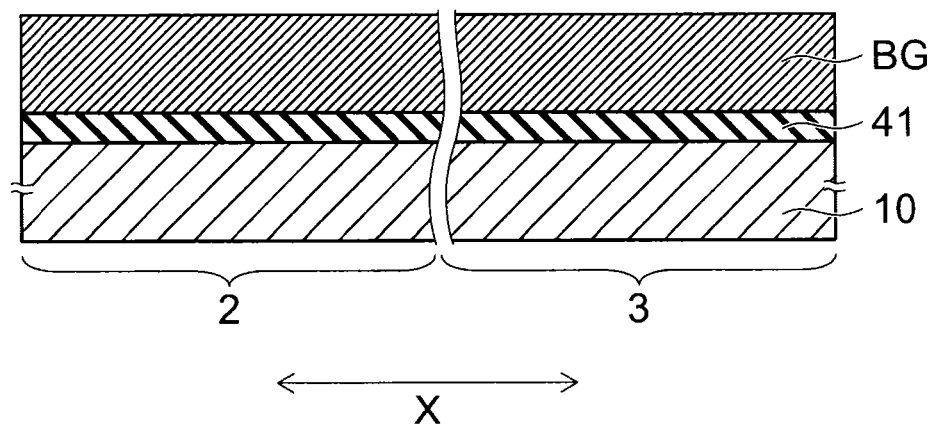
Figure 7:
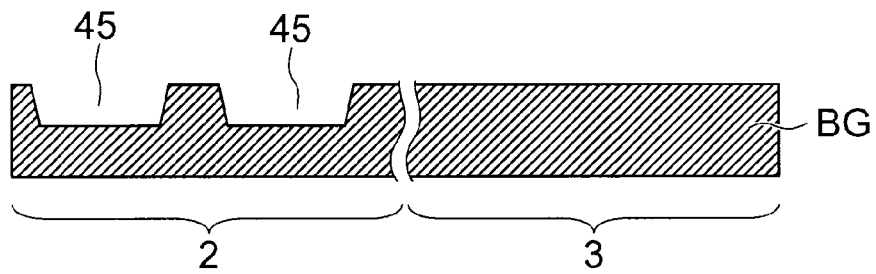

As shown in FIG. 6, the back gate BG is formed on the substrate 10 via the insulating layer (e.g. silicon oxide) 41. The back gate BG is a polysilicon film doped with boron (B) or phosphorus (P). In FIG. 7 and the subsequent drawings, the illustration of the substrate 10 and the insulating layer 41 is omitted.

The back gate BG is formed in the memory region 2 and the peripheral region 3. In the back gate BG in the memory region 2, a plurality of trenches 45 are formed as shown in FIG. 7 by etching using a not-shown mask.

Figure 8:
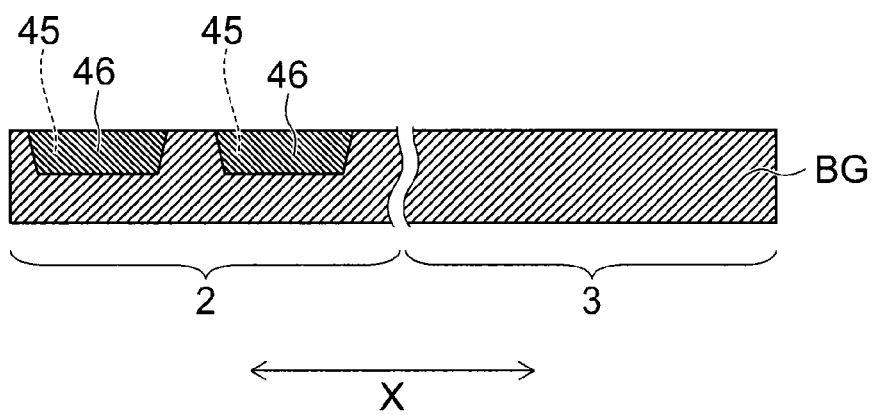

As shown in FIG. 8, a sacrifice film 46 is buried in the trench 45. The sacrifice film 46 is a non-doped silicon film. Here, "non-doped" means that an impurity for providing electrical conductivity is not intentionally added to the silicon film and impurities are not substantially contained other than the elements resulting from the source gas in the film-formation.

The trench 45 and the sacrifice film 46 are not formed in the peripheral region 3.

Figure 9:
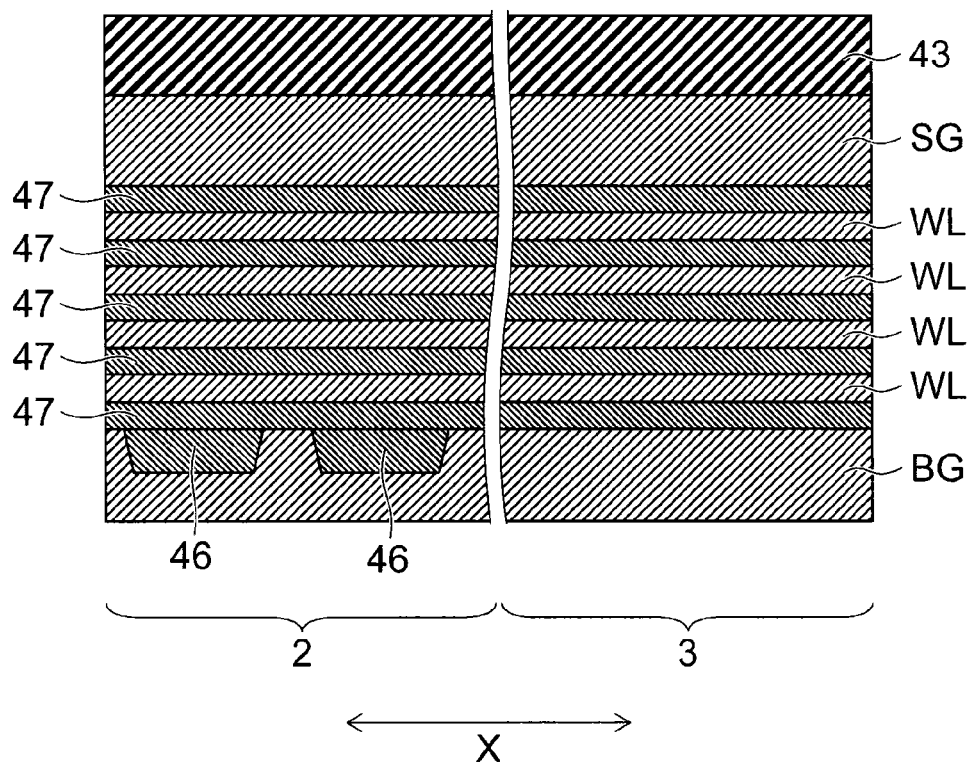

The upper surface of the protruding portion of the back gate BG between a trench 45 and a trench 45 in the memory region 2 is exposed. The upper surface of the protruding portion of the back gate BG and the upper surface of the sacrifice film 46 are flat surfaces flush with each other. As shown in FIG. 9, a non-doped silicon film (second silicon film) 47 and the conductive layer WL are alternately stacked in plural on the flat surface and on the back gate BG in the peripheral region 3.

The select gate SG is formed on the uppermost non-doped silicon film 47, and the insulating layer 43 is formed on the select gate SG. The select gate SG in the memory region 2 forms the drain-side select gate SGD or the source-side select gate SGS as described later.

The back gate BG and the stacked body described above on the back gate BG are formed by, for example, the CVD (chemical vapor deposition) method.

The number of conductive layers WL is arbitrary, and is not limited to four. The number of non-doped silicon films 47 varies with the number of conductive layers WL.

The conductive layer WL is a polysilicon film doped with, for example, boron as an impurity (the first silicon film). The non-doped silicon film 47 as the second silicon film is a silicon film to which an impurity for providing electrical conductivity is not intentionally added, and does not substantially contain impurities other than the elements resulting from the source gas in the film-formation.

The non-doped silicon film 47 is finally replaced with the insulating layer 42 shown in FIG. 1 in a process described later. The non-doped silicon film 47 has a film thickness sufficient to ensure the breakdown voltage between conductive layers WL of the memory cell array 4.

After the stacked body shown in FIG. 9 is formed, photolithography and etching are performed to form a plurality of trenches 51a to 51c that pierce the stacked body, as shown in FIG. 10. The trenches 51a to 51c are formed simultaneously. The trench 51a is formed in the memory region 2, and the trenches 51b and 51c are formed in the peripheral region 3.

The trench 51a separates the stacked body mentioned above in the X direction on the sacrifice film 46 and between adjacent sacrifice films 46. The trench 51a on the sacrifice film 46 reaches the sacrifice film 46. The trench 51a formed between a sacrifice film 46 and a sacrifice film 46 reaches the back gate BG. As shown in FIG. 2, the trench 51a extends in the Y direction.

The trench 51a formed in the memory region 2 separates the select gate SG into the drain-side select gate SGD and the source-side select gate SGS.

The trenches 51b and 51c formed in the peripheral region 3 reach the back gate BG. The trenches 51b and 51c separate the stacked body mentioned above into a plurality of resistance element blocks 6 as shown in FIG. 3.

As shown in FIG. 11, the insulating films 52a to 52c are buried in the trenches 51a to 51c, respectively. The insulating films 52a to 52c are formed simultaneously by, for example, the CVD method. The insulating films 52a to 52c are, for example, a silicon nitride film or a silicon oxide film.

Although the insulating films 52a to 52c are deposited also on the insulating layer 43, the insulating films 52a to 52c on the insulating layer 43 are removed.

After the insulating films 52a to 52c are formed, as shown in FIG. 12, a plurality of holes h are formed in the stacked body mentioned above. The plurality of holes h are formed simultaneously in the memory region 2 and the peripheral region 3 by, for example, the RIE (reactive ion etching) method using a not-shown mask.

The hole h formed in the memory region 2 pierces the stacked body mentioned above to reach the sacrifice film 46. The sacrifice film 46 is exposed at the bottom of the hole h. On one sacrifice film 46, a pair of holes h are formed so as to sandwich the insulating film 52a.

The hole h in the peripheral region 3 is formed in the hole formation portion 6b of the resistance element block 6 shown in FIG. 3A. The hole h in the peripheral region 3 pierces the stacked body mentioned above to reach the back gate BG.

The conductive layer WL, the non-doped silicon film 47, and the select gate SG are exposed at the side wall of the hole h in the memory region 2 and the peripheral region 3.

In a stacked structure of different materials, it is likely to be difficult to form a hole perpendicular to the major surface of the substrate. However, in the embodiment, since all the components of the stacked body between the back gate BG and the insulating layer 43 are silicon films, the setting of the conditions of RIE and the shape controllability of the hole h are easy.

After the hole h is formed, the sacrifice film 46 and the non-doped silicon film 47 are removed by, for example, wet etching. As the etchant at this time, for example, an alkaline chemical liquid such as a KOH (potassium hydroxide) solution is used.

FIG. 13 shows the state after the sacrifice film 46 and the non-doped silicon film 47 are removed by wet etching.

The etching rate of the silicon film to the alkaline chemical liquid depends on the concentration of the impurity doped in the silicon film. For example, when the boron concentration in the silicon film becomes $1\times10^{20}$ (cm$^{-3}$) or more, the etching rate decreases rapidly to become a few percent of that when the boron concentration is $1\times10^{19}$ (cm$^{-3}$) or less.

Therefore, in the embodiment, by the wet etching mentioned above, the non-doped silicon film 47 and the sacrifice film 46, which is likewise a non-doped silicon film, are removed via the hole h. On the other hand, the back gate BG, the conductive layer WL, and the select gate SG, which are silicon films doped with, for example, boron as an impurity, are left.

By the removal of the sacrifice film 46, the trench 45 appears which has been formed in the back gate BG in the previous process. A pair of holes h are connected to one trench 45. That is, in the memory region 2, the bottoms of a pair of holes h are connected to one common trench 45 to form one U-shaped memory hole MH.

By the removal of the non-doped silicon film 47, a space 48 is formed between conductive layers WL. The space 48 leads to the hole h.

The conductive layers WL and the select gate SG are supported by the insulating films 52a to 52c, and the state where the conductive layers WL and the select gate SG are stacked via the space 48 is maintained.

Alternatively, it is also possible to form the hole h and the film in the hole h earlier than the trenches 51a to 51c and then form the trenches 51a to 51c. In this case, the non-doped silicon film 47 and the sacrifice film 46 are removed by etching via the trenches 51a to 51c, while the plurality of conductive layers WL are supported by the film in the hole h.

After the wet etching mentioned above, as shown in FIG. 1, the memory film 30 is formed on the inner wall of the memory hole MH in the memory region 2 and on the side wall of the hole h in the peripheral region 3, and the insulating layer 42 is formed in the space 48.

The memory film 30 includes, as described above with reference to FIG. 5, the block film 31, the charge storage film 32, and the tunnel film 33 stacked in this order from the side of the side wall of the memory hole MH (the hole h). The insulating layer 42 is formed in the space 48 simultaneously with the formation of the memory film 30 on the side wall of the hole h. Therefore, the insulating layer 42 includes at least the block film 31, which is part of the memory film 30.

Depending on the height of the space 48 and the film thickness of each film included in the memory film 30, the space 48 may be filled up with only the block film 31; or a stacked film including the block film 31 and the charge storage film 32 or a stacked film including the block film 31, the charge storage film 32, and the tunnel film 33 may be buried as the insulating layer 42 in the space 48.

After the memory film 30 is formed, the channel body 20 is formed in the memory hole MH in the memory region 2 and in the hole h in the peripheral region 3.

A plurality of U-shaped memory strings MS are formed in the memory region 2. Not-shown contacts, the source line SL and the bit line BL shown in FIG. 4, etc. are formed in the process thereafter.

In the peripheral region 3, no memory string is formed, and the resistance element including the plurality of resistance element blocks 6 shown in FIG. 3A is formed.

The processing on the stacked body in the memory region 2 and the processing on the stacked body in the peripheral region 3 are performed simultaneously. That is, the resistance element in the peripheral region 3 can be formed with no other additional process than the process of forming the memory cell array 4 in the memory region 2. It is sufficient to make only the trench 51c different for the mask pattern in the lithography for forming the trenches 51a to 51c.

In the hole h in the peripheral region 3, an insulating film with a different configuration from the film in the hole h of the memory cell array 4 may be buried.

In the peripheral region 3, a peripheral circuit that controls the memory cell array 4 is formed. That is, the memory cell array 4 and the control circuit thereof are formed on the same substrate 10, and are thus formed on one chip.

The peripheral circuit includes, for example, a CMOS circuit formed on the surface of the substrate 10. The resistance element including the plurality of resistance element blocks 6 shown in FIG. 3A is connected to the peripheral circuit via a not-shown contact and a not-shown interconnection, and functions as the resistance element of the peripheral circuit.

Of the plurality of conductive layers WL in the peripheral region 3, at least one conductive layer WL functions as the resistance element. The conductive layer WL of the memory cell array 4 and the conductive layer WL serving as the resistance element in the peripheral region 3 are not connected.

The impurity concentration of the conductive layer WL serving as the resistance element in the peripheral region 3 is equal to or lower than the impurity concentration of the conductive layer WL serving as the electrode layer in the memory cell array 4, and the resistance of the conductive layer WL serving as the resistance element in the peripheral circuit 3 is equal to or higher than the resistance of the conductive layer WL serving as the electrode layer in the memory cell array 4.

Alternatively, the width in the X direction of the line portion 6a of the resistance element block 6 may be set thinner than the width in the X direction of the conductive layer WL of the memory cell array 4. Thereby, the resistance of the conductive layer WL serving as the resistance element in the peripheral region 3 can be made higher than the resistance of the conductive layer WL serving as the electrode layer in the memory cell array 4.

Alternatively, the conductive layer WL of the memory cell array 4 may be made to contain a silicide. Thereby, the resistance of the conductive layer WL of the memory cell array 4 can be made lower than the resistance of the conductive layer WL in the peripheral region 3.

In the embodiment, the resistance element is provided using part of the stacked body forming the memory cell array 4. That is, the resistance element is not formed using the material of the gate electrode of the CMOS formed on the substrate surface, but the conductive layer WL on the same story as the conductive layer WL of the memory cell array 4 can be used as the resistance element. Thus, a CMOS circuit can be formed below the stacked body, and the area of the peripheral circuit region, eventually the chip size can be reduced.

The resistance element block 6 of the embodiment has, as shown in FIG. 3A, the line portion 6a extending in the Y direction and the hole formation portion 6b protruding in the X direction from the line portion 6a. The hole h is not formed in the line portion 6a, but is formed in the hole formation portion 6b. By means of the hole h, the non-doped silicon film 47 is removed by etching also in the peripheral region 3.

The conductive layer WL is formed by, for example, the CVD method, and the resistance of the conductive layer WL itself forming the resistance element block 6 is almost uniform regardless of the place. Therefore, the current flowing through the resistance element block 6 tends to pass through the shortest path and mainly flows along the Y direction through the line portion 6a in which the hole h is not formed (goes straight), and hardly goes round to the hole formation portion 6b. Therefore, the processing variation of the hole h (the variation of the hole diameter) does not influence the resistance variation of the resistance element.

There may be a structure in which the same patterning as the memory region 2 shown in FIG. 2 is performed also on the conductive layer WL in the peripheral region 3 and a structure in which the hole h is formed in the line portion is used as the resistance element (a comparative example). However, in the comparative example, the hole h exists in the current path, and the processing variation of both patterns of the trench 51a and the hole h influences the resistance variation of the resistance element. It may be possible to take a measure that enlarges the whole resistance element pattern to such a degree that the processing variation of the patterns of the trench 51a and the hole h does not influence the resistance variation of the resistance element. However, this leads to an increase in the chip area.

By the embodiment, the influence of the hole processing variation on the resistance variation can be suppressed by devising the pattern configuration of the trench 51c as described above, without enlarging the whole resistance element pattern. Thus, the area of the resistance element, eventually the chip size can be reduced.

Figure 3B:
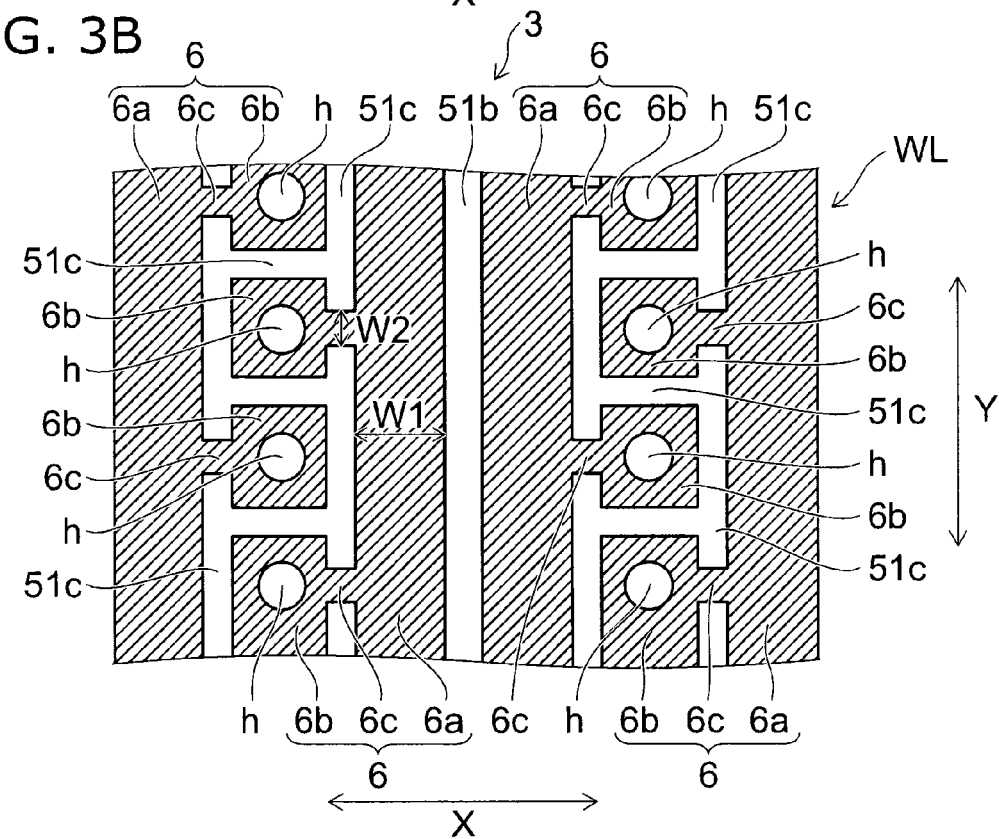

FIG. 3B shows another planar pattern of the resistance element block 6.

This resistance element block 6 has the line portion 6a and the hole formation portion 6b similarly to FIG. 3A, but the portion (connection portion) 6c where the hole formation portion 6b is integrally connected to the line portion 6a is constricted to be made thinner. That is, the width W2 in the Y direction of the connection portion 6c mentioned above is smaller than the width W1 in the X direction of the line portion.

Consequently, the current flowing in the Y direction through the line portion 6a is less likely to detour to the hole formation portion 6b, and the influence of the hole diameter variation on the resistance element can be further reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
   a underlying film;
   a stacked body including a plurality of insulating layers and a plurality of conductive layers alternately stacked on the underlying film; and
   a first insulating film provided in a trench piercing the stacked body in a stacking direction of the stacked body and separating the stacked body into a plurality of resistance element blocks in a first direction on the underlying film,
   the resistance element blocks including:
   a line portion formed of the conductive layer extending in a second direction crossing the first direction and the stacking direction of the stacked body; and
   a hole formation portion provided to protrude in the first direction from the line portion and including a second insulating film provided in a hole piercing the stacked body in the stacking direction of the stacked body.

2. The device according to claim 1, wherein a width in the second direction of the conductive layer in a portion where the hole formation portion is connected to the line portion is smaller than a width in the first direction of the line portion.

3. The device according to claim 1, wherein the hole formation portion is provided in a plurality for the one line portion to be aligned in the second direction.

4. The device according to claim 1, wherein the trench bends in the first direction and the second direction.

5. The device according to claim 4, wherein the hole formation portion of one resistance element block of the resistance element blocks adjacent in the first direction across the bending trench and the hole formation portion of one other resistance element block protrude in directions opposite to each other.

6. The device according to claim 5, wherein the hole formation portion of the one resistance element block and the hole formation portion of the one other resistance element block are alternately aligned in the second direction via the trench.

7. The device according to claim 1, wherein the conductive layer is a silicon film doped with an impurity.

8. The device according to claim 1, wherein the underlying film is a silicon film doped with an impurity.

9. A semiconductor device comprising:
an underlying film;
a stacked body including a plurality of insulating layers and a plurality of conductive layers alternately stacked on the underlying film, the stacked body including a memory region and a peripheral region around the memory region;
a channel body provided in a first hole formed to pierce the stacked body in the memory region in a stacking direction of the stacked body;
a memory film provided between a side wall of the first hole and the channel body and including a charge storage film; and
a first insulating film provided in a trench piercing the stacked body in the peripheral region in the stacking direction of the stacked body and separating the stacked body into a plurality of resistance element blocks in a first direction on the underlying film,
the resistance element blocks including:
a line portion formed of the conductive layer extending in a second direction crossing the first direction and the stacking direction of the stacked body; and
a hole formation portion provided to protrude in the first direction from the line portion and including a second insulating film provided in a second hole piercing the stacked body in the stacking direction of the stacked body.

10. The device according to claim 9, wherein a width in the second direction of the conductive layer in a portion where the hole formation portion is connected to the line portion is smaller than a width in the first direction of the line portion.

11. The device according to claim 9, wherein the hole formation portion is provided in a plurality for the one line portion to be aligned in the second direction.

12. The device according to claim 9, wherein the trench bends in the first direction and the second direction.

13. The device according to claim 12, wherein the hole formation portion of one resistance element block of the resistance element blocks adjacent in the first direction across the bending trench and the hole formation portion of one other resistance element block protrude in directions opposite to each other.

14. The device according to claim 13, wherein the hole formation portion of the one resistance element block and the hole formation portion of the other resistance element block are alternately aligned in the second direction via the trench.

15. The device according to claim 9, wherein the conductive layer is a silicon film doped with an impurity.

16. The device according to claim 9, wherein the underlying film is a silicon film doped with an impurity.

17. The device according to claim 9, wherein the second insulating film is a stacked film of a same film as the memory film and a same film as the channel body.

* * * * *